United States Patent [19]

Perry

[11] Patent Number: 5,258,653

[45] Date of Patent: Nov. 2, 1993

[54] POWER EFFICIENT VOLTAGE TO CURRENT COVERTER

[75] Inventor: Stuart D. Perry, Rochester, N.Y.

[73] Assignee: Eastman Kodak Company, Rochester, N.Y.

[21] Appl. No.: 767,713

[22] Filed: Sep. 30, 1991

[51] Int. Cl.$^5$ ............................................. H02J 1/00
[52] U.S. Cl. ............................... 307/74; 323/269; 323/274; 323/350; 363/65; 363/73
[58] Field of Search ............... 307/74, 75; 363/65, 363/73; 323/269, 274, 350

[56] References Cited

U.S. PATENT DOCUMENTS

| | | | |
|---|---|---|---|
| 3,530,359 | 9/1970 | Grist | 307/75 |
| 3,636,381 | 1/1972 | Press | 307/43 |
| 4,035,715 | 7/1977 | Hutchinson | 323/20 |
| 4,075,502 | 2/1978 | Wally, Jr. | 307/64 |
| 4,131,827 | 12/1978 | Larrabee | 318/45 |
| 4,270,165 | 5/1987 | Carpenter et al. | 363/65 |
| 4,587,604 | 5/1987 | Nerone | 363/17 |
| 4,638,175 | 1/1987 | Bradford et al. | 307/64 |
| 4,730,122 | 3/1988 | Dreibelbis et al. | 307/75 |
| 4,814,963 | 3/1989 | Peterson | 363/20 |

Primary Examiner—Jeffrey Sterrett
Attorney, Agent, or Firm—William W. Holloway

[57] ABSTRACT

A power efficient amplifier uses two stages, a low voltage stage and a high voltage stage. The low voltage stage supplies a nominal operating current to a load from a low voltage low power output when the requirements are small, and the high voltage stage supplies a desired output current to the load exceeding the nominal operating current when the load requires such. Switching to the high voltage output stage in response to sensing current to the load exceeding the nominal operating current conserves energy and increases operational efficiency. The amplifier circuitry produces a power efficient voltage-to-current transformation. The circuitry includes an operational amplifier that receives a signal proportional to the current flowing to the load and, an input signal which represents the desired load current. When the output increases above a certain level, it turns off the low voltage stage and turns on the high voltage stage causing the available output power to increase. A power efficient amplifier is obtained by operating with the lowest required output power.

3 Claims, 4 Drawing Sheets 5,258,653

POWER EFFICIENT VOLTAGE TO CURRENT COVERTER

TECHNICAL FIELD

This invention relates generally to power supplies and, more particularly, relates to a power efficient amplifier for producing a voltage-to-current transformation useful in applications such as motor control where current through a motor coil produces a proportional force.

BACKGROUND OF THE INVENTION

It is desirable to have a power efficient amplifier that produces a voltage to current transformation. The voltage to current transformation is desired in such applications as motor control where the current through the motor coil produces a proportional force. One approach to the design of a power efficient amplifier is illustrated in prior art FIG. 1 which illustrates a closed loop current amplifier. In the closed loop current amplifier, an input voltage, $V_{in}$, is applied to the input of the circuit. An amplifier in conjunction with a power stage serves to force the output voltage, $V_{out}$, equal to the input voltage, $V_{in}$. The appearance of $V_{out}$ across the sampling resistor, $R_s$, is associated with a current $I_{out}$ that flows through the sampling resistor, $R_s$. Because of the properties of the amplifier, its input current $I_1$ and $I_2$ are very close to zero, so that practically all of the current $I_{out}$ is supplied by the power stage. The current through the load, $I_{load}$, is then approximately equal to $I_{out}$ and produces a voltage at the output of the power stage of $V_p$ which is equal to the product of $I_{out}$ multiplied by the sum of $Z_{load}$ and $R_s$. The magnitude of $V_p$ must be less than or equal to the magnitude of the supply voltage $V_s$ for the circuit to operate properly. The power required for operation is the product of the supply voltage and output current, assuming that the amplifier draws negligible current.

A problem with such an amplifier is that it must be constructed to deliver the maximum required power, which means that it will be inefficient at some loads. Also, building for the peak demand is necessarily more expensive than building for lesser current demands. These disadvantages are evident in applications where the nominal value of the load current $I_1$, $I_{1n}$ is much less than its maximum value, $I_{1m}$. The power supply voltage must be chosen for proper operation at $I_{1m}$. However it is clear that during nominal operation, the power requirement could be reduced by a factor of $I_{1m}/I_{1n}$ if the power supply voltage could be changed to that determined by $I_{1n}$. Accordingly, it would be highly desirable to have a power supply that operates on the closed loop principle. It is desirable to have a power supply which adjusts the output in response to the demands made for power.

SUMMARY OF THE INVENTION

The present invention is directed to overcoming one or more of the problems set forth above. Briefly summarized, according to one aspect of the present invention, an apparatus comprises a first power output stage for supplying a nominal operating current to a load from a low voltage power source, a second power output stage for supplying a desired output current to the load exceeding the nominal operating current of the low voltage power source and means for sensing the current to the load. The apparatus also includes means for switching to the second power output stage in response to sensing current to the load exceeding the nominal operating current.

The apparatus includes a circuit for producing a power efficient voltage to current transformation. The circuitry includes an operational amplifier having its inverting input receiving a voltage proportional to the current flowing to the load. The noninverting input receives a voltage proportional to the desired load current. When the desired load current is less than nominal, the low power stage supplies the power while the high power stage is off. When the desired current rises above its nominal value, the low power stage shuts off and the load current is supplied by the high power stage.

The present invention provides a power efficient amplifier by using two stages, a low voltage stage and a high voltage stage. The low voltage stage provides a low power output when the requirements are small, and the high voltage stage provides a high power output when the load requires such. By using the two stages and utilizing the low power stage when possible, energy is conserved and the amplifier operates more efficiently.

These and other aspects objects, features and advantages of the present invention will be more clearly understood and appreciated from a review of the following detailed description of the preferred embodiments and appended claims, and by reference to the accompanying drawings.

DETAILED DESCRIPTION OF THE PREFERRED EMBODIMENTS

Figure 1:
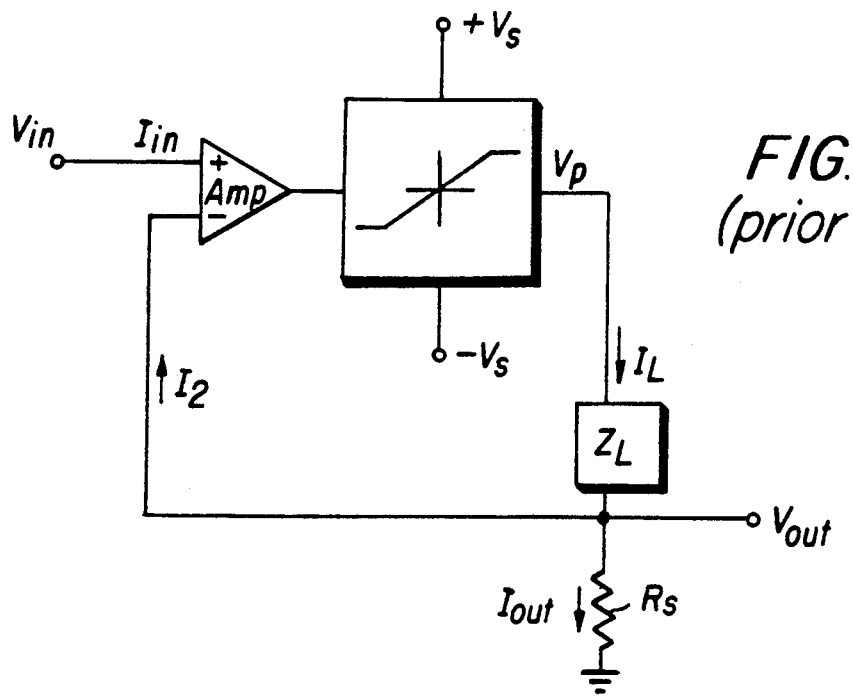
FIG. 1 is a prior art figure illustrating a conventional closed loop current amplifier.
Figure 2:
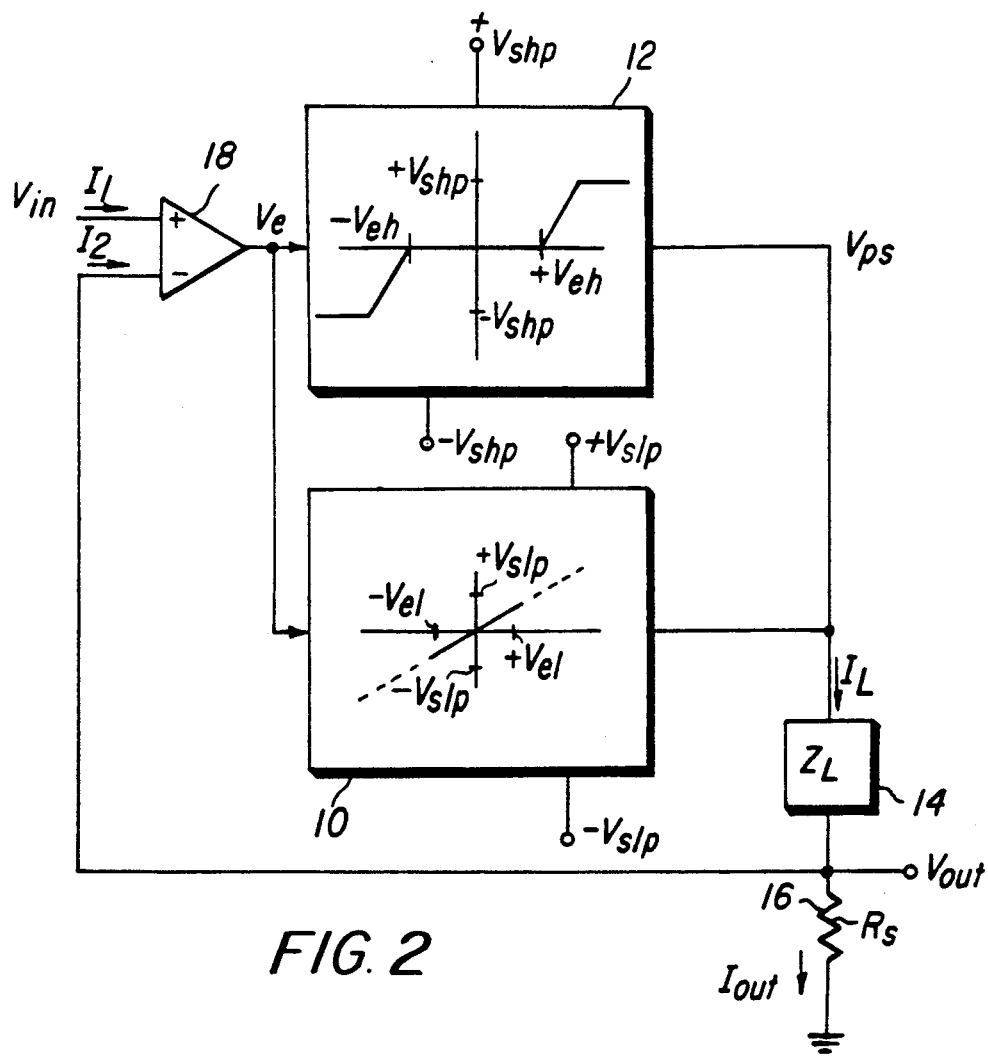
FIG. 2 is a block diagram illustrating a preferred embodiment of a power amplifier with multiple stages according to the present invention.
Figure 3:
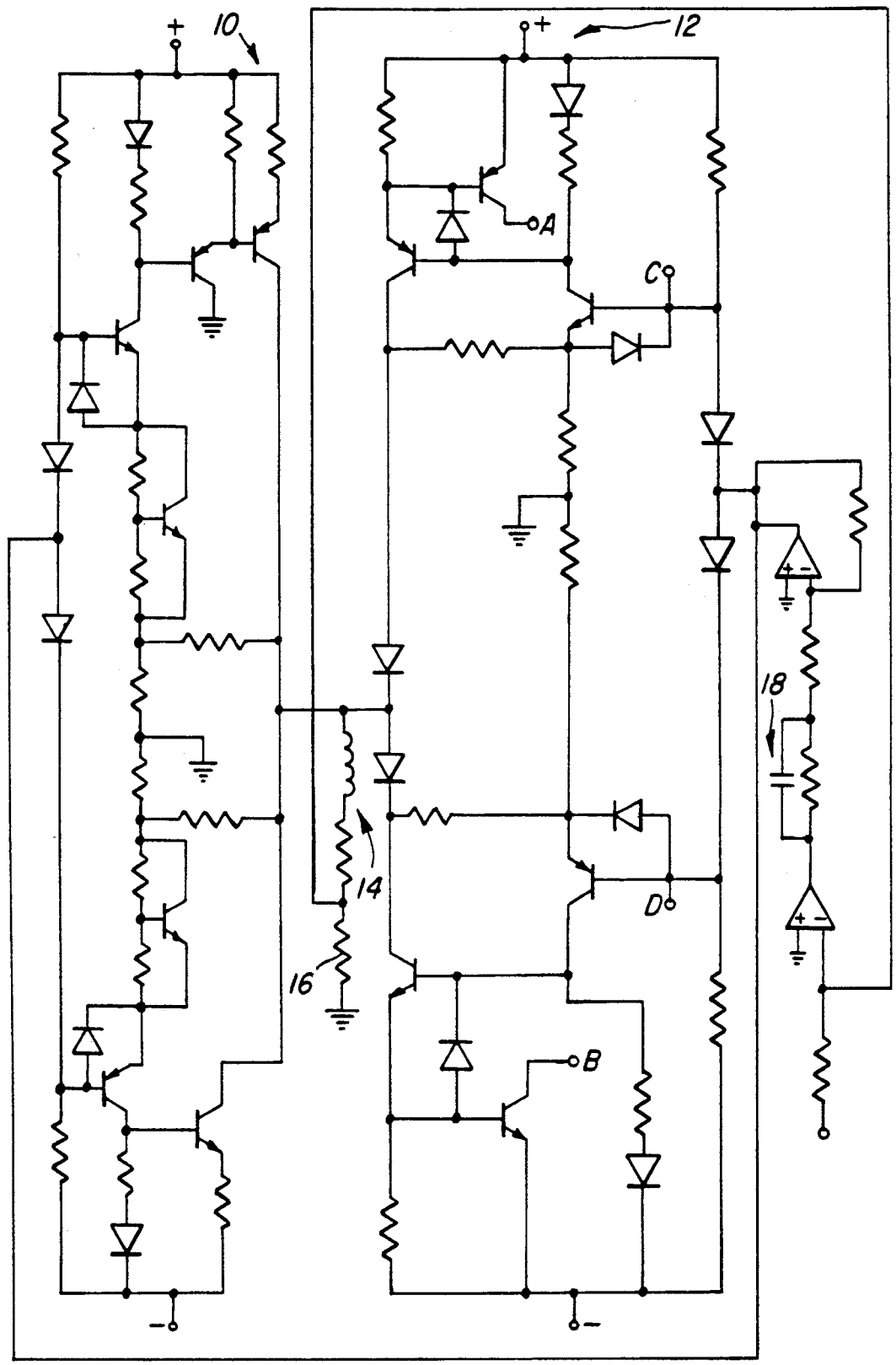
FIG. 3 is a schematic diagram illustrating the amplifier stages of FIG. 2 in greater detail.

Referring now to the drawings in which like numerals indicate like elements throughout the several figures, FIGS. 2 and 3 illustrate a circuit that produces a power efficient voltage to current transformation. The circuit includes a low power output stage 10 and a high power output stage 12. The low power output stage 10 supplies the nominal operating output current from a power supply determined by the nominal operating current, $I_{1n}$. The high power output stage 12 provides any current required above nominal from a high voltage power supply determined by the maximum operating current $I_{1m}$. During nominal operation, the high power output 12 is off and draws negligible power from the voltage power supply. The circuitry also include the load impedance 14 and sampling resistor 16. An operational amplifier 18 completes the basic circuitry which senses the need for operating current above the nominal current and turns on the high power output stage 12 to accommodate the current need. The circuit draws approximately the same power as conventional circuits when operating at any current level above the nominal current level but draws a reduced power when only nominal operating current is required. At the reduced power level, the power consumption is reduced by a factor of $I_{1m}/I_{1n}$.

The amplifier 18, in conjunction with the power stages 10, 12, serves to force the output voltage $V_{out}$ equal to the input voltage $V_{in}$. The appearance of the output voltage $V_{out}$ across the sampling resistor 16 is associated with a current $I_{out}$ that flows through the sampling resistor 16 ($I_{out} \cong V_{out}/R_{16}$). Because of the properties of the amplifier 1, its input currents $I_1$ and $I_2$ are very close to zero, so that practically all of the current $I_{out}$ is supplied by the power stages 10, 12. The current through the load 14, $I_L$, is then approximately equal to $I_{out}$ and produces a voltage at the output of the power stages of $V_{ps}=I_{OUT}(Z_L+R_s)$. The low power stage shuts off and does not contribute current to the load when the required value of $V_{ps}$ exceeds the low power supply voltage, $|V_{1ps}|$. In this state, all of the load current must be supplied by the high power stage 12. The high power stage 12 is shut off for all low current values of nominal or less and turns on only when the load current is greater than the nominal.

The output of the amplifier 18, $V_e$, is the parameter that actually controls the states of the two power stages 10, 12. For minimal power dissipation, only the low power stage 10 should be on for nominal values of load current. This condition implies that the magnitude of the voltage that shuts off the low power stage, $|V_{e1}|$, should be less than the magnitude of the voltage that shuts off the high power stage, $|V_{eh}|$. Also, $V_{e1}$ must be less than or equal to the low power supply voltage, $V_{slp}$. The operation of the low and high power stages is essentially the same except that the high power stage is designed to stay off until $|V_e|$ exceeds a predetermined threshold (namely, $V_{eh}$).

Figure 4:
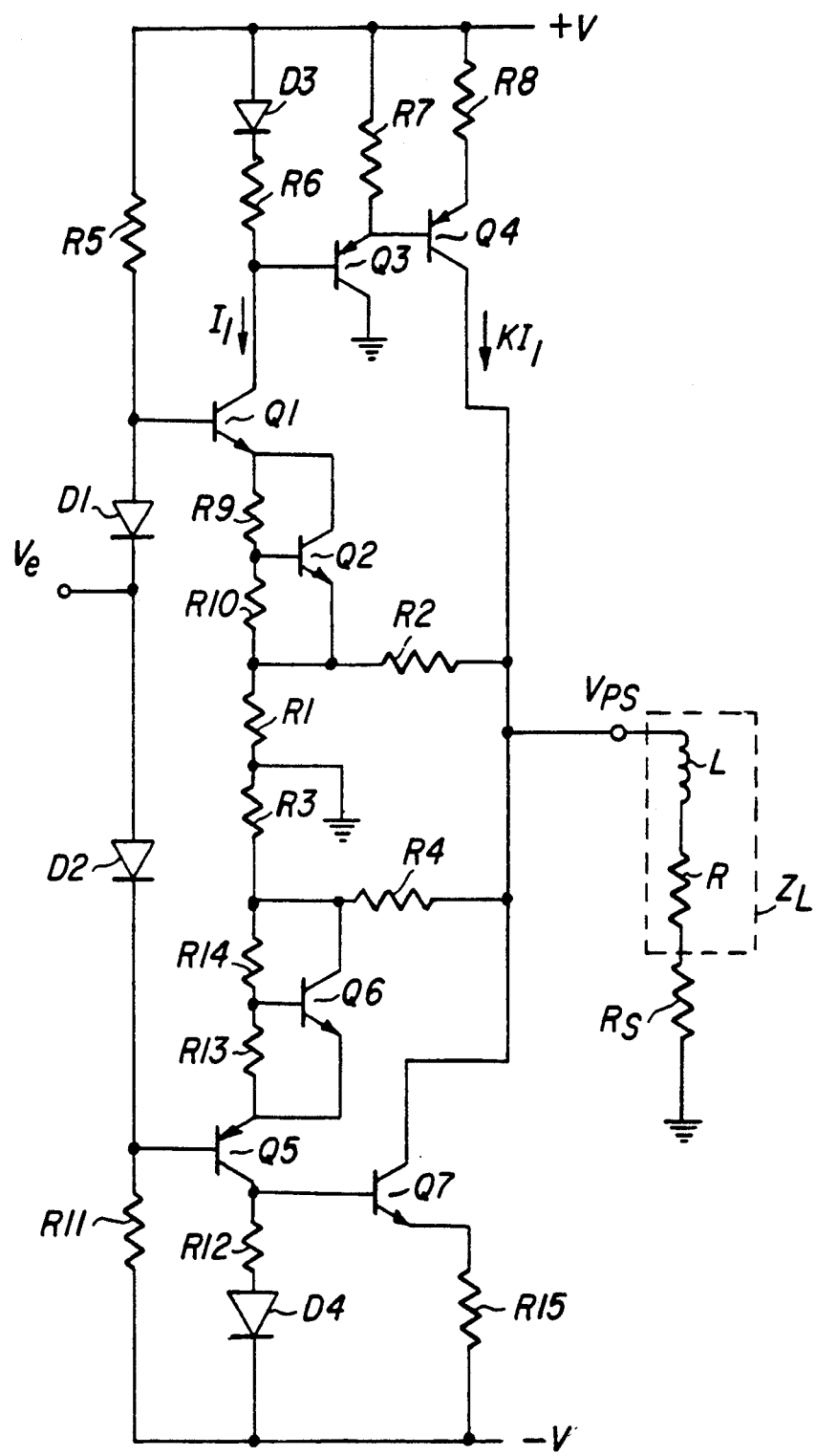
FIG. 4 is a schematic diagram illustrating the high power amplifier stage of FIG. 2 in greater detail.
Figure 5:
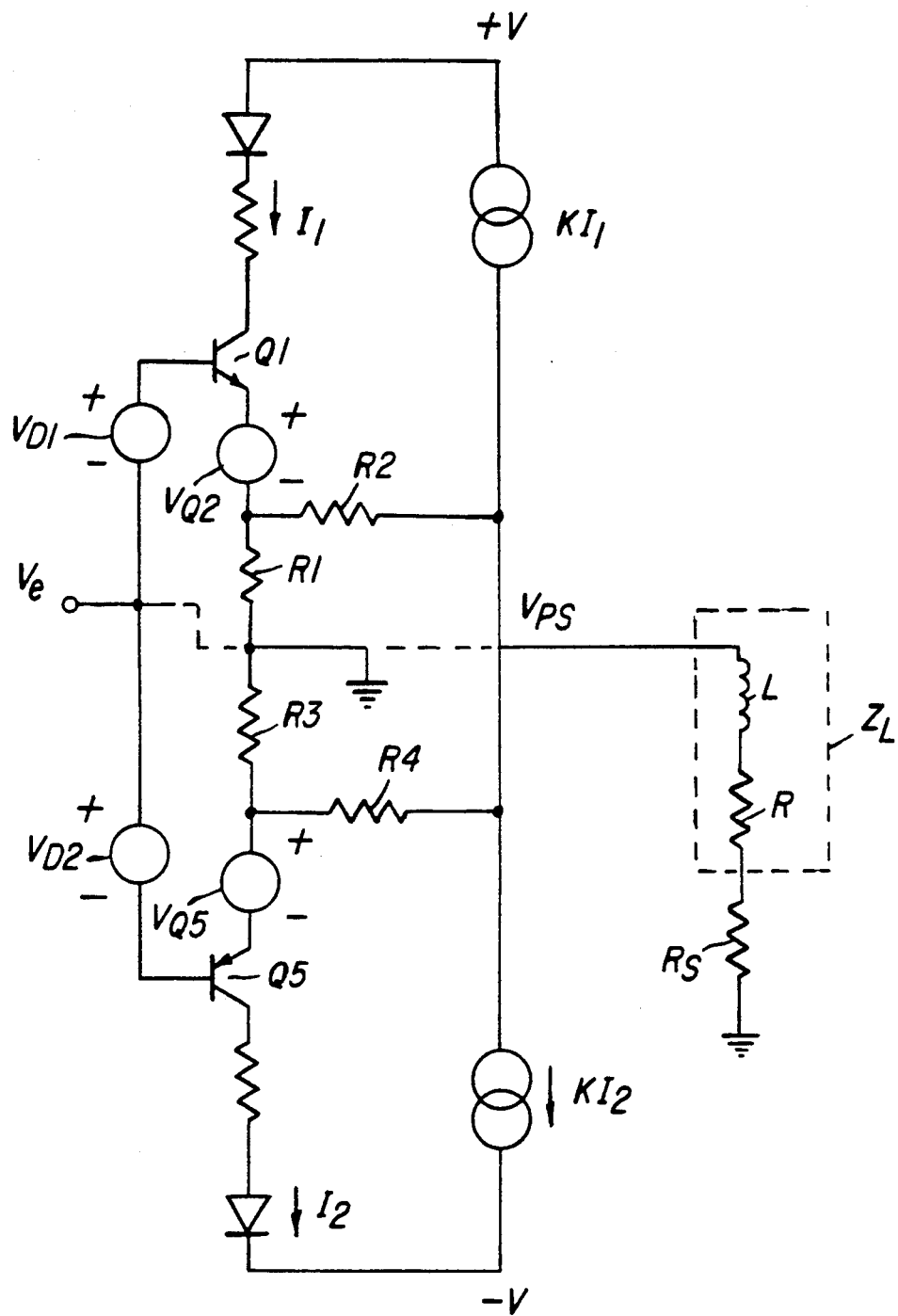
FIG. 5 is a schematic diagram illustrating an equivalent circuit of the high power amplifier stage of FIG. 4.

Referring now to FIG. 4 and 5, for positive values of $V_e$, only the top portion of the circuit comprising $D_1$, $D_3$, $R_1$, $R_2$, $R_5$-$R_{10}$ and $Q_1$-$Q_4$, is active. Only the bottom portion of the circuit is active for negative values of $V_e$. The voltage across diode $D_1$ is less than the sum of the collector to emitter voltage across transistor $Q_2$ and the base to emitter voltage of transistor $Q_1$. The voltage across diode $D_2$ is less than the sum of the collector to emitter voltage across transistor $Q_6$ and the base to emitter voltage of transistor $Q_5$. Expressed mathematically:

$$V_{D1} < V_{BE,Q1} + V_{CE,Q2} \text{ and}$$
$$V_{D2} < V_{BE,Q5} + V_{CE,Q6}$$

When $V_e+V_{D1} > V_{BE,Q1}+V_{CE,Q2}$, the top portion of the circuit becomes active current $I_1$ is generated so that:

$$I_1 = \frac{V_{in} + V_{D1} - V_{BEQ1} - V_{CEQ2}}{R_1}.$$

A controlled current source, KI, produces a current of value $KI_1$ with $K>>1$. current $KI_1$ flows primarily through the load which comprised of the motor coil impedance, $Z_L$, and s resistor, $R_s$, and produces a voltage $V_{ps}$. The $V_{ps}$ also generates a current through resistor $R_2$. The circuit reaches equilibrium when the currents through resistors $R_1$ and $R_2$ are equal. The currents are equal when:

$$\frac{V_{in} + V_{D1} - V_{BEQ1} - V_{CEQ2}}{R_1} = \frac{V_{ps}}{R_1 + R_2}$$

which can be restated as:

$$\frac{V_{ps}}{V_{in} + V_{D1} - V_{BEQ1} - V_{CEQ2}} = 1 + \frac{R_2}{R_1}$$

If $V_{in} < V_{D1} - V_{BE,Q1} - V_{CE,Q2}$, the upper half of the circuit is off. The voltage $V_{D1} - V_{BE,Q1} - V_{CE,Q2}$ is a constant voltage. And the effect of the circuit is to provide a voltage gain of $$1 + \frac{R_2}{R_1},$$

provided the input $V_e$ is greater than $(-V_{D1}+V_{BE,Q1}+V_{CE,Q2})$.

The circuit transfer function is graphically illustrated in FIG. 2. The slope of the voltage between $-V_{eh}$ and $+V_{eh}$ is zero. The slope for input voltages greater than $-V_{D1}+V_{BE,Q1}+V_{CE,Q2}$ is $$1 + \frac{R_2}{R_1}.$$

Operation of the present invention is believed to be apparent from the foregoing description and drawings, but a few words will be added for emphasis. The operation of the circuit under the stimulus of a ramping positive input voltage $V_{in}$ is as follows. $V_{in}$ begins to ramp positive and the action of the amplifier 18 forces the output voltage $V_{out}$ to follow by increasing the amplifier output voltage $V_e$. This results in an increase in the load current $I_L$. When the input voltage forces the amplifier output voltage $V_e$ greater than the low power amplifier output voltage $V_{e1}$, then the low power stage 10 shuts off. At this instant, the output voltage $V_{out}$ is no longer equal to the input voltage $V_{in}$. At this point, the required current $I_1$ is greater than nominal. The amplifier senses this disparity between $V_{in}$ and $V_{out}$ and begins to rapidly increase $V_e$ until the high power stage 12 turns on and supplies the required current to force $V_{in} = V_{out}$.

Because the power amplifier closes a feedback loop around the output stages (i.e., $V_e$ changes in response to the difference between $V_{in}$ and $V_{out}$) the change in $V_e$ which causes the switching between the low power stage and the high power output stage occurs in a fast and controlled fashion. Points A and B in FIG. 3 serve to sense the current from the low power output stage 10 while points C and D combined with additional circuitry serve to shut off the low power output stage 10.

The present invention may also be operated as a power efficient voltage amplifier. In this configuration, the feedback to the amplifier 18 is made from the output of the power stages 10, 12 not the voltage across the sampling resistor 16. The power amplifier would then control the voltage across the load 14 instead of the current through the load. Again, the output power stages supply the load current which would switch on as needed to supply the required load voltage and current. Operation with more than two output power stages and more than two power supply voltages is possible. This would allow for greater power efficiency at each of the nominal operating currents. The claim described in this document is a method for designing a power efficient amplifier. Specifically, the present invention does four things: It first senses the required load current in response to an input signal, then supplies the required load current from the minimum required power supply voltage, thereby minimizing the power dissipation. Next, it switches between the required power supplies in a controlled manner and, lastly, provides switching to a high voltage power supply only when required.

While the invention has been described with particular reference to a preferred embodiment, it will be understood by those skilled in the art that various changes may be made and equivalents may be substituted for elements of the preferred embodiment without departing from invention. In addition, many modifications may be made to adapt a particular situation and material to a teaching of the invention without departing from the essential teachings of the present invention.

As is evident from the foregoing description, certain aspects of the invention are not limited to the particular details of the examples illustrated, and it is therefore contemplated that other modifications and applications will occur to those skilled in the art. It is accordingly intended that the claims shall cover all such modifications and applications as do not depart from the true spirit and scope of the invention.

What is claimed is:

1. A circuit for producing a power efficient voltage-to-current transformation, said circuit producing a positive or a negative current in a load impedance in response to an input signal, said circuit comprising:

a low-power output stage for supplying an output operating current from a positive nominal value to a negative nominal value, said low-power output stage being energized by a low-voltage power source;

a high-power output stage for supplying a desired current greater than said positive nominal output current or less than said negative nominal value, said high-power output stage being energized by a high-voltage power source; and means for switching to said high-power output stage in response to sensing a need for current outside of a range determined by said nominal value of said operating current.

2. An apparatus, comprising:

a first power output stage for supplying an operating current from a positive nominal value to a negative nominal value, said first power output stage energized by a low-voltage power source;

a second power output stage for supplying, on demand from a high-voltage power source, a desired output current greater than said positive nominal value or less than said negative nominal value of operating current of said first power output stage;

means for sensing said operating current; and means for switching to said second power output stage in response to sensing said operating current is outside of a range determined by said positive and said negative nominal values of operating current.

3. The apparatus, as set forth in claim 2, wherein said means for switching includes an operational amplifier circuit to provide controlled switching.

* * * * *

UNITED STATES PATENT AND TRADEMARK OFFICE
CERTIFICATE OF CORRECTION

PATENT NO. : 5,258,653
DATED : November 2, 1993
INVENTOR(S) : Stuart D. Perry

It is certified that error appears in the above-indentified patent and that said Letters Patent is hereby corrected as shown below:

ON THE TITLE PAGE:

Title, line 2
    Delete "COVERTER" and insert --CONVERTER--.

Column 6, line 13
    Delete "value" and insert --values--.

Signed and Sealed this

Nineteenth Day of April, 1994

Attest:

BRUCE LEHMAN

*Attesting Officer*      *Commissioner of Patents and Trademarks*